(12) United States Patent
Tang et al.

(10) Patent No.: US 10,515,705 B1
(45) Date of Patent: Dec. 24, 2019

(54) REMOVING PUMP NOISE IN A SENSING CIRCUIT

(71) Applicant: Wuhan Xinxin Semiconductor Manufacturing Co., Ltd., Wuhan, Hubei Province (CN)

(72) Inventors: Yuan Tang, San Jose, CA (US); Jen-Tai Hsu, San Jose, CA (US)

(73) Assignee: Wuhan Xinxin Semiconductor Manufacturing Co., Ltd., Wuhan, Hubei Province (CN)

( * ) Notice: Subject to any disclaimer, the term of this patent is extended or adjusted under 35 U.S.C. 154(b) by 0 days.

(21) Appl. No.: 16/198,856

(22) Filed: Nov. 22, 2018

(51) Int. Cl.
| | | |
|---|---|---|
| *G11C 16/04* | (2006.01) | |
| *G11C 16/26* | (2006.01) | |
| *G11C 16/30* | (2006.01) | |
| *G11C 16/24* | (2006.01) | |
| *G11C 5/14* | (2006.01) | |
| *G11C 16/10* | (2006.01) | |
| *H03H 11/04* | (2006.01) | |

(52) U.S. Cl.
CPC .............. *G11C 16/26* (2013.01); *G11C 5/145* (2013.01); *G11C 16/10* (2013.01); *G11C 16/24* (2013.01); *G11C 16/30* (2013.01); *H03H 11/04* (2013.01)

(58) Field of Classification Search
CPC ......... G11C 16/26; G11C 5/145; G11C 16/10; G11C 16/24; G11C 16/30; H03H 11/04
USPC ...................................................... 365/185.18
See application file for complete search history.

(56) References Cited

U.S. PATENT DOCUMENTS

2002/0033720 A1* 3/2002 Ikehashi ................ G11C 5/143
327/143

* cited by examiner

*Primary Examiner* — Huan Hoang
(74) *Attorney, Agent, or Firm* — Winston Hsu

(57) ABSTRACT

A sensing circuit includes a plurality of cascode transistors including: a Flash memory cell; a sensing node; and an NMOS. The sensing circuit further includes a charge pump for generating an output voltage. A first output voltage is directly input to the plurality of cascode transistors during programming, and a second output voltage of the charge pump is coupled to a gate of the NMOS during a read to bias the NMOS. A sensing amplifier has an input coupled to the sensing node for receiving read data of the Flash memory cell when the NMOS is biased. A low-pass filter is coupled between the second output voltage of the charge pump and the gate of the NMOS.

7 Claims, 2 Drawing Sheets

REMOVING PUMP NOISE IN A SENSING CIRCUIT

BACKGROUND OF THE INVENTION

1. Field of the Invention

This invention relates to sensing circuits, and more particularly, to a sensing circuit wherein noise is removed from the output of a charge pump.

2. Description of the Prior Art

A sense amplifier forms part of a sensing circuit used in computer memories. The sensing circuit compares a reference current with a current sunk by a memory cell. A resultant voltage will be high or low, depending on whether the current sunk by the memory cell is greater than or less than the reference current, wherein a high resultant voltage corresponds to a read of '0' representing that the memory cell is programmed, and a low resultant voltage corresponds to a read of '1' representing that the memory cell is erased. The sense amplifier amplifies the sensed voltage to generate a read result.

A conventional sensing circuit consists of a plurality of transistors coupled between a power supply VDD and ground, and a sense amplifier coupled to a sensing node. A pump generates a voltage which is passed directly to the plurality of coupled transistors, enabling the sensing circuit to perform a current comparison so that a resultant voltage can be sensed by the sensing node and then amplified and output by the sensing amplifier.

The amount of current the memory cell sinks will depend on the threshold voltage of the memory cell. When the memory cell is being programmed, the pump provides a bias voltage to the memory cell. The voltage across the memory cell goes high meaning the current sunk by the memory cell is less than a reference current sourced by a first transistor coupled to VDD. The voltage at the sensing node will go high representing a '0', meaning the memory cell is programmed. During a read, the pump provides a large enough voltage to make the plurality of transistors conductive. The current sunk by the memory cell therefore becomes greater than the reference current, due to a low threshold voltage across the memory cell. The voltage at the sensing node will go low representing a'1% meaning the memory cell is erased. The resultant value at the sensing node can thereby be output by the sense amplifier as a read result.

The sensing node is therefore very sensitive to variations in voltage level. As is well-known, a pump has a clock input, and a feedback path to regulate the strength of the pump. When the output pump strength is not high enough with comparison to a reference, the frequency of the input clock cycles will be increased to charge the pump, and when the pump strength becomes higher than the reference, the clock will be stopped to stop the pump from charging. This combination of regulation and changing clock cycles causes ripples to be present in the pump output. The resultant noise in the pump output may influence the voltage at the sensing node, resulting in a wrong read result.

SUMMARY OF THE INVENTION

This in mind, it is an objective of the present invention to provide a sensing circuit which includes a low-pass filter for preventing ripples in a charge pump output.

A sensing circuit according to an exemplary embodiment of the present invention comprises a plurality of cascode transistors coupled between a power supply and ground, the plurality of cascode transistors comprising: a Flash memory cell; a sensing node; and an NMOS having a drain coupled to the sensing node and a source coupled to ground. The sensing circuit further comprises a charge pump for generating an output voltage, wherein a first output voltage of the charge pump is directly input to the plurality of cascode transistors during programming of the Flash memory cell, and a second output voltage of the charge pump is coupled to a gate of the NMOS during a read of the Flash memory cell to bias the NMOS; a sensing amplifier having an input coupled to the sensing node for receiving read data of the Flash memory cell when the NMOS is biased, and amplifying and outputting the read data to generate a read result; and a low-pass filter coupled between the second output voltage of the charge pump and the gate of the NMOS. The low-pass filter comprises: a transistor having a source coupled to the second output voltage of the charge pump and a drain coupled to the gate of the NMOS; and a decoupling capacitor coupled between the drain of the transistor and ground.

A first switch is coupled between the first output voltage and the plurality of cascode transistors, and a second switch is coupled between the second output voltage and the plurality of cascode transistors. The plurality of cascode transistors further comprises a data bit line node and an inverse data bit line node, wherein the drain of the NMOS is coupled to the inverse data bit line node and the source of the NMOS is coupled to the data bit line node. During programming of the Flash memory cell, the first switch will be turned on to bias the data bit line node, and during a read of the Flash memory cell, the second switch will be turned on to bias the gate of the NMOS to pass a value of the data bit line node to the inverse data bit line node.

A method for generating a read result of data stored in a memory cell according to an exemplary embodiment of the present invention comprises coupling a plurality of cascode transistors between a power supply and ground, the plurality of cascode transistors comprising: a Flash memory cell; a sensing node; and an NMOS having a drain coupled to the sensing node and a source coupled to ground. The method further comprises, during a read of the Flash memory cell, generating a first voltage; low-pass filtering the first voltage; biasing the NMOS by inputting the low-pass filtered first voltage to a gate of the NMOS; receiving read data of the Flash memory cell; and amplifying and outputting the read data to generate a read result. During programming of the Flash memory cell, the method comprises: generating a second voltage; and directly inputting the second voltage to the plurality of cascade transistors.

The plurality of cascade transistors further comprises a data bit line node; and an inverse data bit line node. The drain of the NMOS is coupled to the inverse data bit line node and the source of the NMOS is coupled to the data bit line node, and the method further comprises: during programming of the Flash memory cell, inputting the second voltage to a first switch; turning on the first switch to directly input the second voltage to the data bit line node; and biasing the data bit line node to store a value of the Flash memory. During a read of the Flash memory cell, inputting the low-pass filtered voltage to a second switch; turning on the second switch to input the low-pass filtered voltage to the gate of the NMOS; and biasing the gate of the NMOS with the low-pass filtered voltage to pass a value of the data bit line node to the inverse data bit line node and the sensing node.

These and other objectives of the present invention will no doubt become obvious to those of ordinary skill in the art after reading the following detailed description of the preferred embodiment that is illustrated in the various figures and drawings.

DETAILED DESCRIPTION

As described above, a sensing circuit receives a voltage from a charge pump, wherein a bias voltage is provided to the sensing circuit during programming of a memory cell in order to store a data value, and a larger voltage is provided during a read in order to generate a read result representing the stored data value.

Due to the clock input and regulation required for a charge pump, ripples/noise will be present in the pump output, which can affect the accuracy of a read result from the sensing amplifier. The present invention therefore provides a low-pass filter coupled to the pump output, which can smooth the ripples present in the voltage signal output by the pump.

Figure 1:
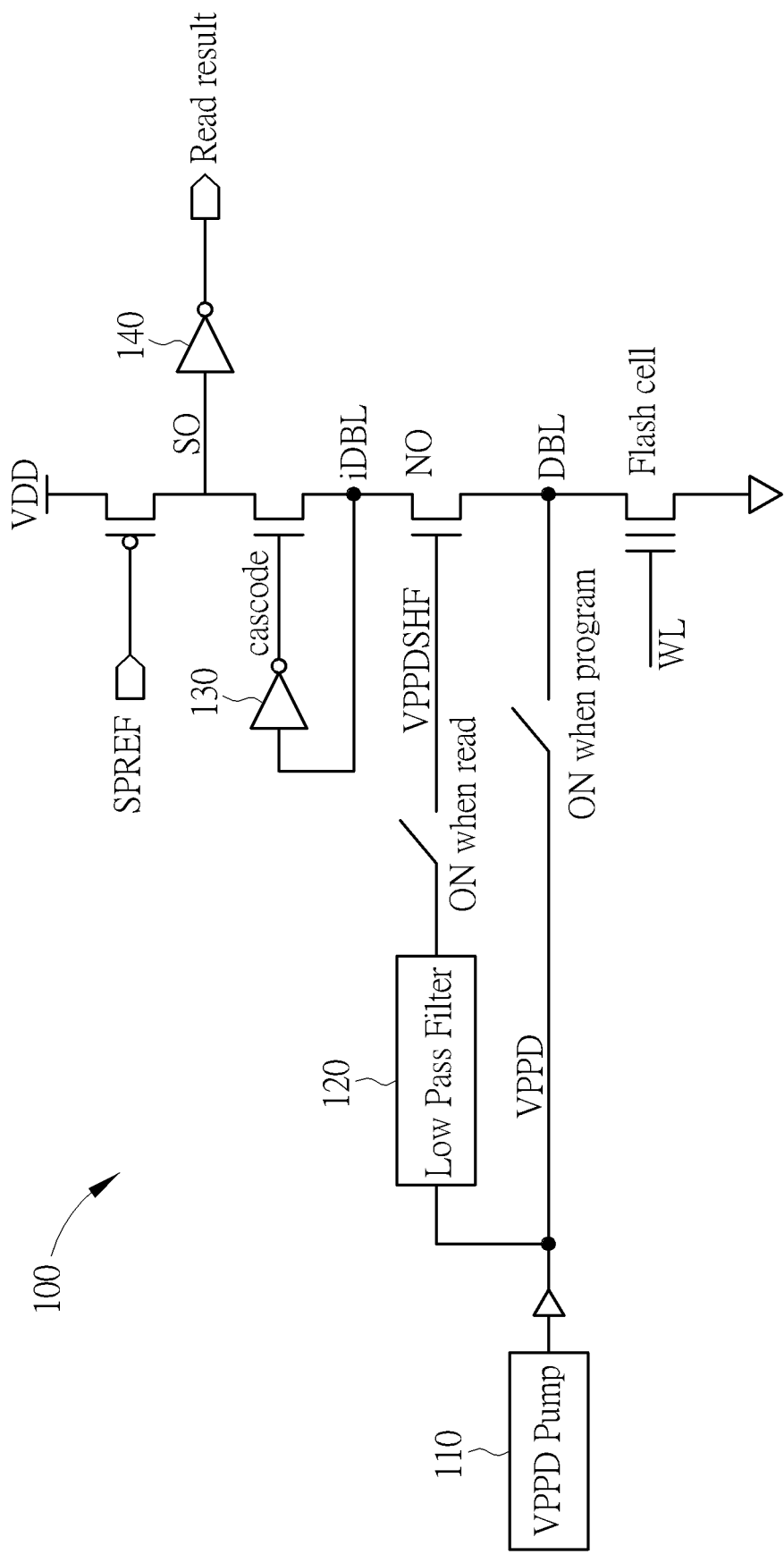
FIG. 1 is a diagram of a sensing circuit according to an exemplary embodiment of the present invention.

Refer to FIG. 1, which is a diagram of a sensing circuit 100 according to an exemplary embodiment of the present invention. As shown in the diagram, the sensing circuit 100 comprises a VPPD pump 110, which generates an output VPDD which is passed, via a first switch, to node DBL in a plurality of coupled transistors in a cascode topology. The output of the pump 110 is also passed to a low-pass filter 120, which passes an output VPPDSHF, via a second switch, to the gate of transistor NO. The top transistor in the series of coupled transistors has a drain coupled to a power supply VDD and a gate coupled to a reference voltage SPREF. The second transistor has a source coupled to node iDBL and a gate coupled to a cascode amplifier 130, wherein the node iDBL is further input to the cascode amplifier 130. The bottom transistor is a Flash memory cell which has a gate coupled to a word line and a source coupled to ground. Further, there is a sensing node SO between the top transistor and the second transistor, wherein the sensing node SO is coupled to the input of a sensing amplifier 140. The sensing amplifier 140 generates a read result.

As shown in the diagram, the output of the low-pass filter couples to the gate of transistor NO. During a read, the gate will be biased by signal VPPDSHF. This enables the data signal stored in DBL to be passed to iDBL and thereby to the sensing node SO, so that a read result unaffected by ripples can be generated by the sense amplifier 140.

During programming, a logical bit ZERO or ONE will be input to the Flash cell via the word line. The output of the pump VPPD biases the node DBL, enabling the value of the logical bit to be stored in the Flash cell. Although there is no low-pass filter coupled between VPPD and node DBL, so that there will still be ripples present on the signal VPPD, node DBL is not overly sensitive to noise. Further, during programming, a sufficiently large voltage must be provided in order to bias DBL so a low-pass filter cannot be inserted here.

If the pump output were directly applied to the gate of NO, noise in the output would be coupled to node iDBL, and this noise would be passed on to the sensing node due to the capacitance between the drain and gate of NO. By applying the low-pass filter 120 between the pump output and the node iDBL, all noise during read can be filtered out.

Figure 2A:
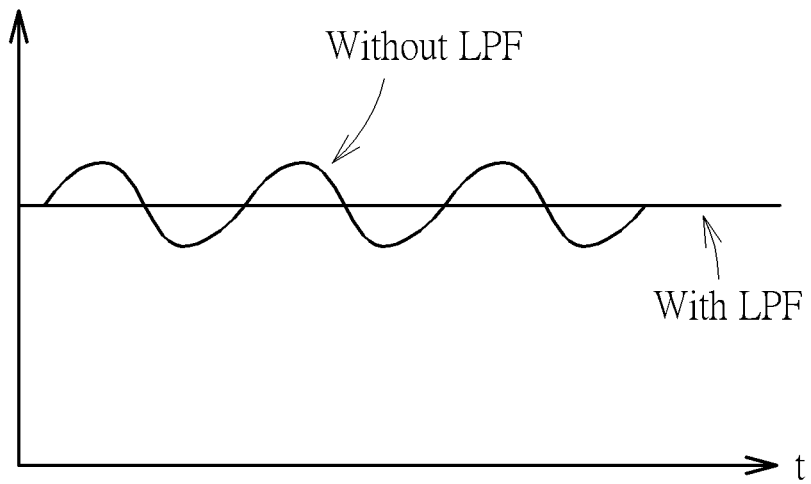
FIG. 2A is a diagram showing the pump output with and without a low-pass filter.

Refer to FIG. 2A which is a diagram of the pump output without a low-pass filter and with a low-pass filter. As shown in the graph, ripples are present on the pump output VPPD, which results in ripples being present at the node iDBL and also at the sensing node SO. When the low-pass filter is added, this noise is smoothed out, resulting in a steady signal which can guarantee a correct read result.

Figure 2B:
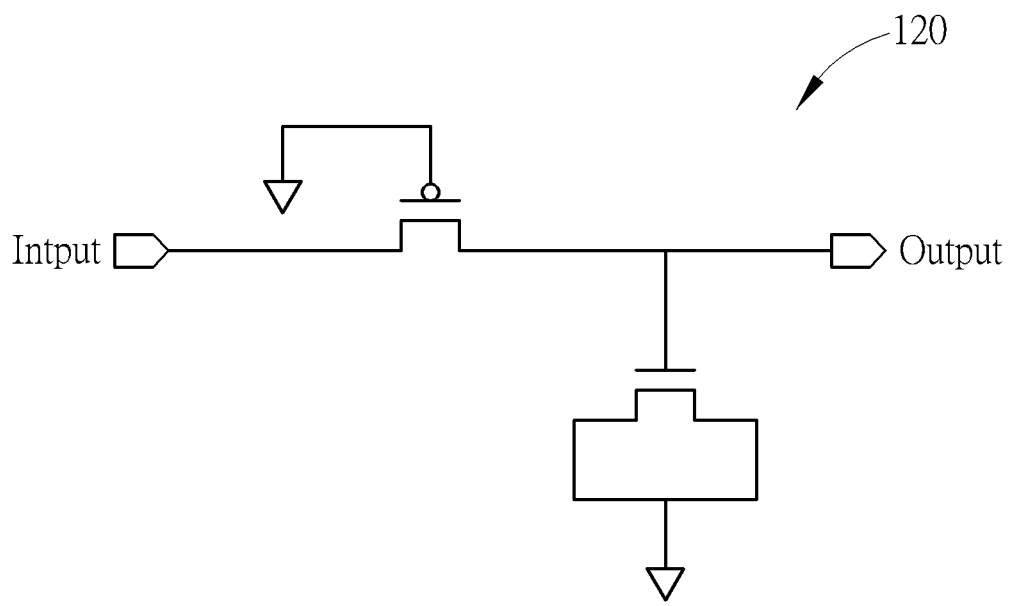
FIG. 2B is a diagram of the low-pass filter shown in FIG. 1.

FIG. 2B is a diagram of the low-pass filter 120. As shown in the diagram, the low-pass filter 120 comprises an input which is coupled to the source of a transistor which has its gate coupled to its source. The drain of the transistor is coupled to a decoupling capacitor and an output of the low-pass filter 120. The decoupling capacitor is coupled to ground. The transistor operates as a resistor. During a read, the output of the low-pass filter 120 is used to bias the gate of NO. As the gate will not conduct any current, the resistor in the low-pass filter 120 will not undergo any voltage drop.

Implementation of the above circuit is simple, as only a transistor is required for the low-pass filter 120. As is well-known, a sensing circuit already comprises a decoupling capacitor, which can be used in the low-pass filter 120. The low-pass filter 120 will only be used during a read, and will not affect the programming. The circuit 100 of the present invention is therefore simple to implement and cost effective.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A sensing circuit for generating a read result of data stored in a memory cell, the sensing circuit comprising:
   a plurality of cascode transistors coupled between a power supply and ground, the plurality of cascode transistors comprising:
   a Flash memory cell;
   a sensing node; and
   an NMOS transistor having a drain coupled to the sensing node and a source coupled to ground;
   a charge pump for generating an output voltage, wherein a first output voltage of the charge pump is directly input to the plurality of cascode transistors during programming of the Flash memory cell, and a second output voltage of the charge pump is coupled to a gate of the NMOS during a read of the Flash memory cell to bias the NMOS transistor;
   a sensing amplifier having an input coupled to the sensing node for receiving read data of the Flash memory cell when the NMOS transistor is biased, and amplifying and outputting the read data to generate a read result; and
   a low-pass filter coupled between the second output voltage of the charge pump and the gate of the NMOS transistor.

2. The sensing circuit of claim 1, further comprising a first switch coupled between the first output voltage and the plurality of cascode transistors, and a second switch coupled between the second output voltage and the plurality of cascode transistors.

3. The sensing circuit of claim 2, wherein the plurality of cascade transistors further comprises
 a data bit line node; and
 an inverse data bit line node;
 wherein the drain of the NMOS transistor is coupled to the inverse data bit line node and the source of the NMOS transistor is coupled to the data bit line node; during programming of the Flash memory cell, the first switch will be turned on to bias the data bit line node, and during a read of the Flash memory cell, the second switch will be turned on to bias the gate of the NMOS transistor to pass a value of the data bit line node to the inverse data bit line node and the sensing node.

4. The sensing circuit of claim 1, wherein the low-pass filter comprises:
 a transistor having a source coupled to the second output voltage of the charge pump and a drain coupled to the gate of the NMOS transistor; and
 a decoupling capacitor coupled between the drain of the transistor and ground.

5. A method for generating a read result of data stored in a memory cell, the method comprising:
 coupling a plurality of cascode transistors between a power supply and ground, the plurality of cascode transistors comprising:
  a Flash memory cell;
  a sensing node; and
  an NMOS transistor having a drain coupled to the sensing node and a source coupled to ground;
 during a read of the Flash memory cell, generating a first voltage;
 low-pass filtering the first voltage;
 biasing the NMOS transistor by inputting the low-pass filtered first voltage to a gate of the NMOS transistor;
 receiving read data of the Flash memory cell; and
 amplifying and outputting the read data to generate a read result.

6. The method of claim 5, wherein during programming of the Flash memory cell, the method comprises:
 generating a second voltage; and
 directly inputting the second voltage to the plurality of cascode transistors.

7. The method of claim 6, wherein the plurality of cascade transistors further comprises
 a data bit line node; and
 an inverse data bit line node;
 wherein the drain of the NMOS transistor is coupled to the inverse data bit line node and the source of the NMOS transistor is coupled to the data bit line node, and the method further comprises:
 during programming of the Flash memory cell, inputting the second voltage to a first switch;
 turning on the first switch to directly input the second voltage to the data bit line node; and
 biasing the data bit line node to store a value of the Flash memory;
 and during a read of the Flash memory cell, inputting the low-pass filtered voltage to a second switch;
 turning on the second switch to input the low-pass filtered voltage to the gate of the NMOS transistor; and
 biasing the gate of the NMOS transistor with the low-pass filtered voltage to pass a value of the data bit line node to the inverse data bit line node and the sensing node.

* * * * *